(12) United States Patent
Sato

(10) Patent No.: US 6,379,747 B1
(45) Date of Patent: *Apr. 30, 2002

(54) THIN FILM FORMING METHOD AND APPARATUS

(75) Inventor: Junichi Sato, Saku (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,742

(22) Filed: Dec. 21, 1998

(30) Foreign Application Priority Data

Dec. 25, 1997 (JP) ............................. 9-357845

(51) Int. Cl.⁷ .............................................. C23C 16/00
(52) U.S. Cl. .................................... 427/248.1; 427/598
(58) Field of Search ..................... 204/298.11; 118/720, 118/715; 427/248.1, 598

(56) References Cited

U.S. PATENT DOCUMENTS

| | | | | |
|---|---|---|---|---|
| 3,632,439 A | * | 1/1972 | Deklerk .................... 118/720 |
| 3,678,889 A | * | 7/1972 | Murakami et al. ......... 118/720 |
| 4,207,836 A | * | 6/1980 | Nonaka ...................... 118/720 |
| 4,436,602 A | * | 3/1984 | Harra et al. ............ 204/192.15 |
| 4,478,174 A | * | 10/1984 | Ranger ....................... 118/719 |
| 4,683,838 A | * | 8/1987 | Kimura et al. .............. 118/715 |
| 4,888,211 A | * | 12/1989 | Oka et al. ................... 427/251 |
| 5,026,454 A | * | 6/1991 | Parmenter et al. ......... 118/715 |
| 5,047,390 A | * | 9/1991 | Higashino et al. ........... 427/62 |
| 5,132,105 A | * | 7/1992 | Remo ......................... 118/715 |
| 5,427,671 A | * | 6/1995 | Ahmed .................. 204/298.11 |
| 5,618,388 A | * | 4/1997 | Seeser et al. ............... 427/539 |
| 5,635,455 A | * | 6/1997 | Okuda et al. ................ 427/62 |
| 5,985,356 A | * | 11/1999 | Schultz et al. ................ 427/8 |
| 5,993,904 A | * | 11/1999 | Boucher ................ 204/298.11 |

FOREIGN PATENT DOCUMENTS

JP          6-349662           12/1994

* cited by examiner

Primary Examiner—Bret Chen
(74) Attorney, Agent, or Firm—Oliff & Berridge PLC (57) ABSTRACT

A method and an apparatus for forming a thin film are provided to achieve precise control of a film thickness. In a thin film forming apparatus a shutter provided between a target and a substrate is rotated a plurality of times during a film forming process so that a slit of the shutter passes between the target and the substrate a plurality of times. A thin film forming substance thereby arrives at the substrate from the target a plurality of times in an intermittent manner. A thin film having a predetermined thickness is thus formed on the substrate.

4 Claims, 5 Drawing Sheets

THIN FILM FORMING METHOD AND APPARATUS

BACKGROUND OF THE INVENTION

1. Field of the Invention

The present invention relates to a method and an apparatus for forming a thin film on an object on which the thin film is to be formed, through having a thin film forming substance emitted from a thin film forming substance supply source arrive at and deposit on the object.

2. Description of the Related Art

A physical vapor deposition (PVD) which is a method of forming a thin film by a physical means such as sputtering or vacuum evaporation is known as one of methods of forming a thin film in a manufacturing process of a semiconductor and so on. Sputtering is a method in which a gas for discharge is introduced to a vacuum, a glow discharge is effected between a pair of electrodes so as to generate plasma, a target as a thin film forming substance supply source placed on the cathode is ejected by ions impinging thereon in the plasma and a film is deposited on a substrate (wafer) placed on the anode. Related-art methods of controlling a film thickness in PVD will now be described, taking a thin film forming apparatus using sputtering as an example.

There are mainly three methods as follows among the related-art methods of controlling a film thickness in the thin film forming apparatus using sputtering. The first method is to relatively rotate the substrate and the target as disclosed in Japanese Patent Application Laid-open Hei 6-349662 (1994). In the method the target is fixed and a substrate holder retaining the substrate is rotated, for example.

The second method is to provide a shutter between the substrate and the target, open the shutter only once for the substrate and control a film thickness by the opening duration. The third method is to fix the substrate and the target and control a film thickness by controlling the film forming time.

Figure 6:
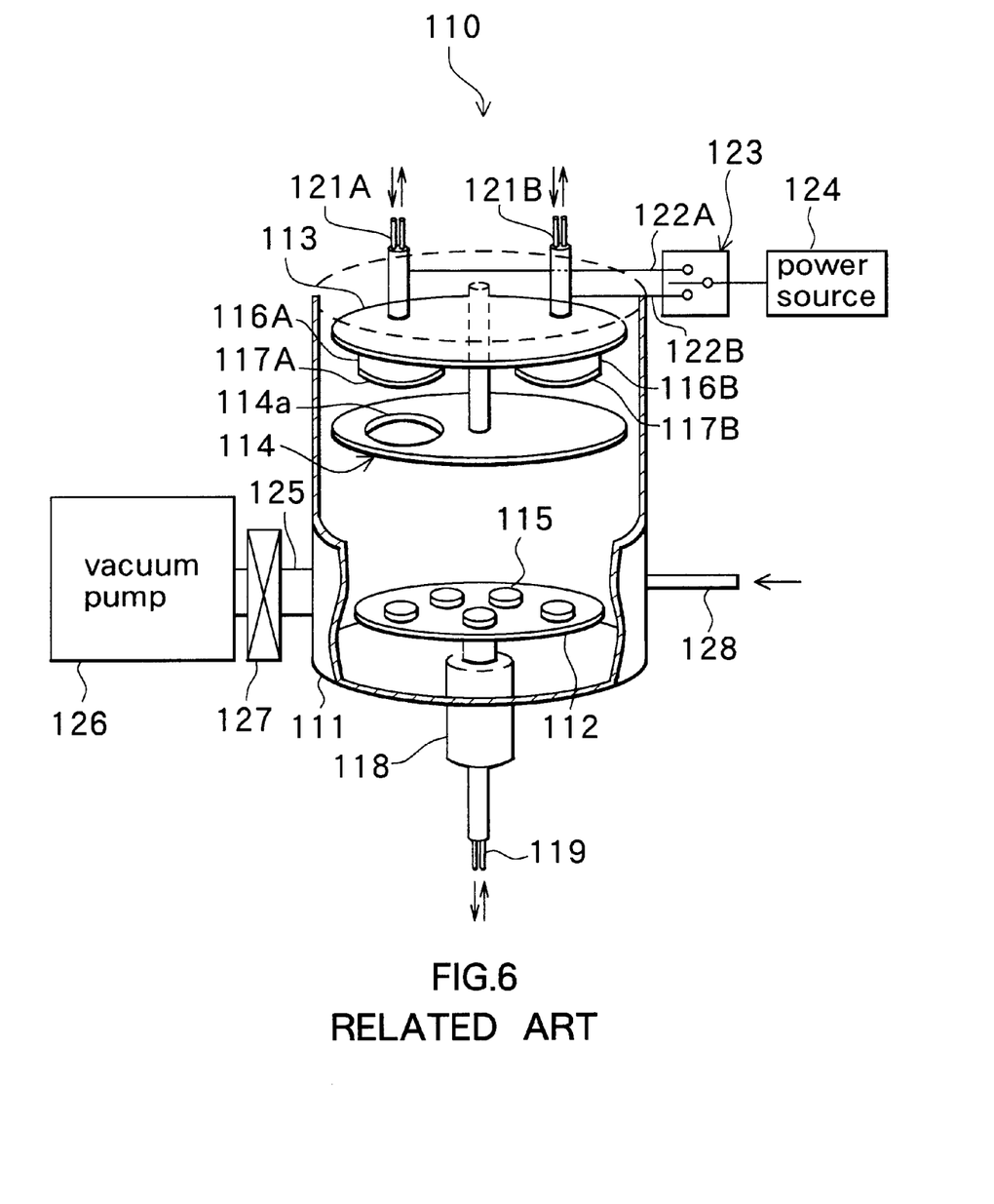
FIG. 6 is a partially cutaway perspective view illustrating an example of the configuration of a related-art thin film forming apparatus.

Reference is now made to FIG. 6 for describing an example of a thin film forming apparatus used for controlling a film thickness by the above-mentioned second method. The thin film forming apparatus 110 comprises: a chamber 111; a substrate holder 112 placed near the lower end in the chamber 111 and functioning as an anode as well; a target support plate 113 placed near the upper end in the chamber 111; and a shutter 114 placed between the substrate holder 112 and the target support plate 113. The substrate holder 112 may hold a plurality of substrates 115. Two target holders 116A and 116B each functioning as a cathode as well are fixed to the target support plate 113. The target holders 116A and 116B may each hold targets 117A and 117B, respectively. The shutter 114 has a circular opening 114a. The diameter of the opening 114a is greater than that of the substrate 115. The shutter 114 is rotatable and allows the opening 114a to selectively face either the target 117A or the target 117B.

A drive axis of a motor 118 provided outside the chamber 111 is coupled to the substrate holder 112 so that the substrate holder 112 is rotated by the motor 118. A cooling water duct 119 is provided near the substrate holder 112. The substrate holder 112 is cooled by letting cooling water flow through the duct 119.

Cooling water ducts 121A and 121B are provided near the target holders 116A and 116B. The target holders 116A and 116B are cooled by letting cooling water flow through the ducts 121A and 121B. Ends of power supply cables 122A and 122B are each connected to the target holders 116A and 116B, respectively. The other ends of the cables 122A and 122B are each connected to fixed contacts of a switch 123, respectively. A moving contact of the switch 123 is connected to a power source 124.

An end of an exhaust pipe 125 is coupled to the chamber 111 so as to communicate with inside the chamber 111. A vacuum pump 126 is coupled to the other end of the exhaust pipe 125. A valve 127 is provided at some midpoint in the exhaust pipe 125. An end of a pipe 128 for a gas for discharge is coupled to the chamber 111 so as to communicate with inside the chamber 111.

Thin film forming steps using the thin film forming apparatus 110 shown in FIG. 6 will now be described. The inside of the chamber 111 is made vacuum by opening the valve 127 and operating the vacuum pump 126. A gas for discharge such as Ar is then introduced to the chamber 111 through the pipe 128. Next, power is supplied from the power source 124 selectively to either the target holder 116A or 116B through the switch 123 so as to generate a glow discharge and plasma in the chamber 111. In this example power is supplied to the target holder 116A so that the substance forming the target 117A is deposited on the substrate 115. At this point the opening 114a of the shutter 114 is located in a position not facing either the target 117A or 117B. The substrate holder 112 is rotated by the motor 118. Next, the opening 114a of the shutter 114 is placed in a position facing the target 117A. The substance forming the target 117A is ejected by ions in the plasma and goes through the opening 114a towards the substrate holder 112. Since the substrate holder 112 is rotating, the substance forming the target 117A deposits on each substrate 115 when the substrate 115 faces the opening 114a and a thin film is thereby formed on the substrate 115. The substrate holder 112 having completed one rotation or several rotations and given time having elapsed, the opening 114a is rotated and placed in a position not facing the target 117A. Thin film formation on every substrate 115 is thus completed.

Developments in giant magnetoresistive (GMR) heads utilizing the GMR effect as thin film magnetic heads have been extensively made. Thin film forming methods such as sputtering described above are used for fabricating a GMR film of such a GMR head. The GMR film is made up of a plurality of layers each of which has a thickness of about some nanometers. Precise control of film thickness is therefore required for fabricating the GMR film.

Figure 7:
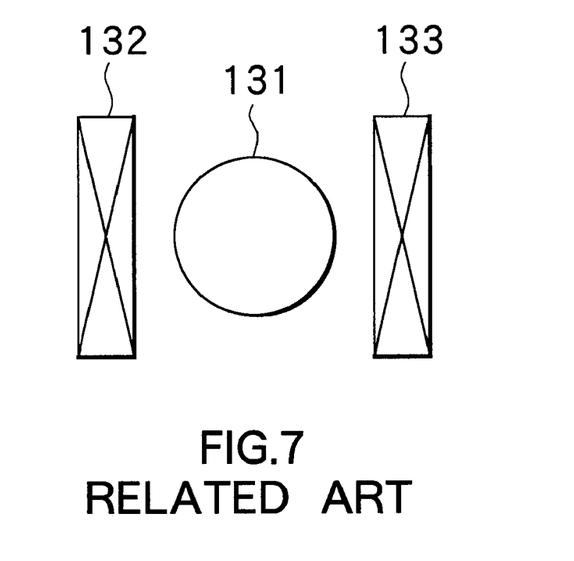
FIG. 7 is an explanatory view for describing a method of forming a thin film with an application of a magnetic field.

A magnetic field is applied for fabricating a magnetic layer of the GMR film through a method such as sputtering. As shown in FIG. 7, magnets 132 and 133 may be placed at sides of a substrate 131 on a substrate holder to apply a magnetic field. The magnets 132 and 133 are placed such that surfaces of the magnets facing each other are magnetic poles different from each other.

However, if a magnetic field is applied for fabricating a layer while rotating the substrate as in the related-art first or second method of film thickness control, the magnets 132 and 133 are rotated as well with the substrate 131 on the substrate holder and the magnetic field is thereby changed in the chamber. As a result, the discharge is made unstable and accuracy of film thickness control is reduced.

In the related-art second method of film thickness control, the shutter is opened only once for the substrate and a thin film having a desired thickness is formed in a single step of film fabrication. It is therefore difficult to precisely form thin films having several types of thickness. In particular, precise control of forming thin films having a thickness of hundreds of picometers to tens of nanometers (some angstroms to hundreds of angstroms).

Figure 8:
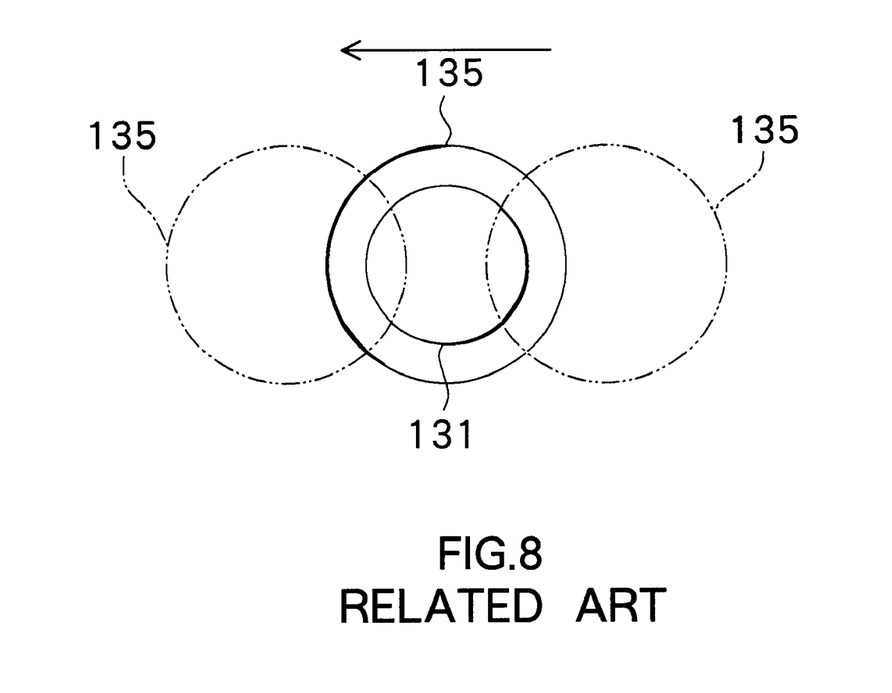
FIG. 8 is an explanatory view for describing a problem of film thickness control in a related-art technique.

In the related-art technique, the opening of the shutter is a circle whose diameter is greater than that of the substrate when the foregoing second method of film thickness control is used. As a result, the thickness distribution on the substrate is made nonuniform. This problem will now be described, referring to FIG. 8. FIG. 8 illustrates a way in which an opening 135 of a shutter moves in the direction indicated with an arrow with respect to the substrate 131. Although the substrate 131 is fixed and the opening 135 moves in FIG. 8, the reverse is acceptable, too, as long as relative movements of the substrate 131 and the opening 135 with respect to each other are achieved. As shown in FIG. 8, when the opening 135 passes over the substrate 131, the center part of the substrate 131, in the direction orthogonal to the direction of movement of the opening 135, faces the opening 135 for a longer time than the other part. The thickness of the center part is therefore increased.

In order to reduce such nonuniformity of the thickness distribution, the diameter of the opening 135 may be sufficiently increased with respect to the substrate diameter. In this case, however, the amount of film formed when the opening 135 passes over the substrate 131 increases. Consequently, it is more difficult to control the film thickness.

In the related-art third method of film thickness control, as in the second method, a thin film having a desired thickness is formed in a single step of film fabrication. It is therefore difficult to precisely form thin films having several types of thickness.

In order to overcome the foregoing problems, a film thickness may be controlled by changing the conditions that affect the film forming speed such as the electric power applied to the target, the distance between the target and the substrate, and the pressure of the gas for discharge. However, if such conditions are changed, the properties of the thin film may be changed. For example, the magnetic properties of a magnetic layer are changed depending on the power applied to the target.

SUMMARY OF THE INVENTION

It is an object of the invention to provide a method and an apparatus for forming a thin film that achieve precise control of a film thickness.

A method of the invention is provided for forming a thin film on an object on which the thin film is to be formed, by having a thin film forming substance emitted from a thin film forming substance supply source arrive at and deposit on the object. The method includes the steps of: providing an intercepting means (device) placed between the supply source and the object, the intercepting means (device) being capable of selecting between interception and allowance of entry of the thin film forming substance from the supply source to the object; and forming the thin film having a predetermined thickness on the object by having the thin film forming substance arrive at the object from the supply source a plurality of times in an intermittent manner through controlling the intercepting means (device).

In the method of the invention the intercepting means (device) preferably includes: an interceptor for intercepting entry of the thin film forming substance from the supply source to the object; and an opening having a shape of a slit whose width is smaller than the length of the object along the direction of the width of the opening and allowing entry of the thin film forming substance from the supply source to the object. The thin film forming substance is made to arrive at the object from the supply source a plurality of times in an intermittent manner by shifting the opening of the intercepting means (device). The opening may be shifted in a rotating manner or in a reciprocating manner.

In the method of the invention the thin film may be formed while the object is fixed and a magnetic field is applied near the object.

An apparatus of the invention is provided for forming a thin film on an object on which the thin film is to be formed, by having a thin film forming substance emitted from a thin film forming substance supply source arrive at and deposit on the object. The apparatus comprises: a supply source holding means (holder) for holding the supply source; an object holding means (holder) for holding the object; and an intercepting means (device), placed between the supply source held by the supply source holding means (holder) and the object held by the object holding means (holder), being capable of selecting between interception and allowance of entry of the thin film forming substance from the supply source to the object. The intercepting means (device) includes: an interceptor for intercepting entry of the thin film forming substance from the supply source to the object; and an opening having a shape of a slit whose width is smaller than the length of the object along the direction of the width of the opening and allowing entry of the thin film forming substance from the supply source to the object; and a shifting means (device) for shifting the opening.

In the apparatus interception or allowance of entry of the thin film forming substance from the supply source to the object is selected by shifting the opening of the intercepting means (device). When entry of the thin film forming substance is allowed, the thin film forming substance emitted from the supply source arrives at the object and deposits thereon. The thin film is thus formed on the object. The opening may be shifted in a rotating manner or in a reciprocating manner.

The apparatus of the invention may further comprise a means (device) for applying a magnetic field near the object.

Other and further objects, features and advantages of the invention will appear more fully from the following description.

DETAILED DESCRIPTION OF THE PREFERRED EMBODIMENTS

Figure 1:
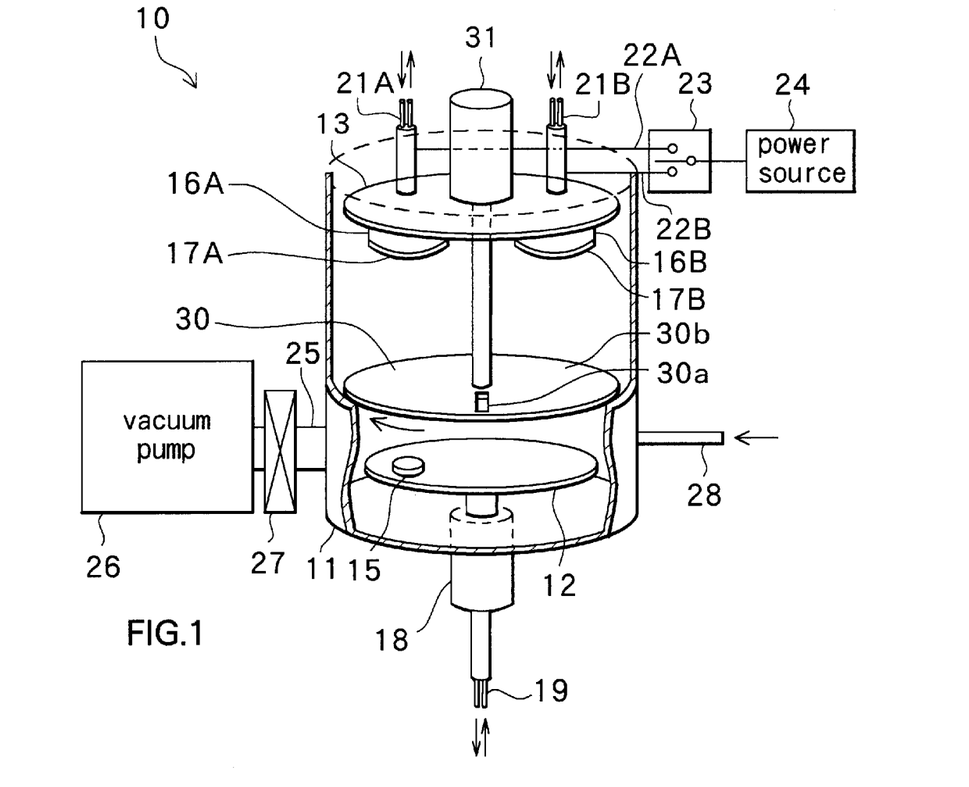
FIG. 1 is a partially cutaway perspective view illustrating a thin film forming apparatus of a first embodiment of the invention.

Preferred embodiments of the invention will now be described in detail with reference to the accompanying drawings. FIG. 1 is a partially cutaway perspective view illustrating a thin film forming apparatus of a first embodiment of the invention. The thin film forming apparatus 10 is an apparatus for forming a thin film on an object on which the thin film is to be formed through having a thin film forming substance emitted from a thin film forming substance supply source arrive at and deposit on the object.

The thin film forming apparatus 10 comprises: a chamber 11; a substrate holder 12 placed near the lower end in the chamber 11 and functioning as an anode as well; a target support plate 13 placed near the upper end in the chamber 11; and a shutter 30 placed between the substrate holder 12 and the target support plate 13. Although the substrate holder 12 holds a single substrate 15 in FIG. 1, the substrate holder 12 may hold a plurality of substrates 15. Two target holders 16A and 16B each functioning as a cathode as well are fixed to the target support plate 13. The target holders 16A and 16B may each hold targets 17A and 17B, respectively.

The targets 17A and 17B each correspond to a thin film forming substance supply source of the invention. The target holders 16A and 16B each correspond to a supply source holding means (holder) of the invention. The substrate 15 corresponds to an object on which the thin film is to be formed of the invention. The substrate holder 12 corresponds to an object holding means (holder) of the invention.

The shutter 30 as a whole takes the shape of a circular plate and has an opening 30a having a shape of a slit extending from a point near the center to a point near the rim. The opening 30a allows a thin film forming substance to arrive at the substrate 15 from the targets 17A and 17B. The part of the shutter 30 other than the opening 30a is an interceptor 30b for intercepting the thin film forming substance arriving at the substrate 15 from the targets 17A and 17B. It is particularly preferable that the distance between the shutter 30 and the substrate holder 12 is 100 mm or below. This is because it is easier to suppress an expansion of the thin film forming substance passing through the opening 30a of the shutter 30 towards the substrate 15 on the substrate holder 12 if the distance between the shutter 30 and the substrate holder 12 is shorter. Accuracy of film thickness control is thereby increased.

A drive axis of a motor 31 provided outside the chamber 11 is coupled to the shutter 30 so that the shutter 30 is rotated by the motor 31. The motor 31 corresponds to a shifting means (device) of the invention.

A drive axis of a motor 18 provided outside the chamber 11 is coupled to the substrate holder 12 so that the substrate holder 12 is rotated by the motor 18. A cooling water duct 19 is provided near the substrate holder 12. The substrate holder 12 is cooled by letting cooling water flow through the duct 19.

Cooling water ducts 21A and 21B are provided near the target holders 16A and 16B. The target holders 16A and 16B are cooled by letting cooling water flow through the ducts 21A and 21B. Ends of power supply cables 22A and 22B are each connected to the target holders 16A and 16B, respectively. The other ends of the cables 22A and 22B are each connected to fixed contacts of a switch 23, respectively. A moving contact of the switch 23 is connected to a power source 24. The power source 24 may apply either a direct-current negative voltage or a high frequency voltage to the target holders 16A and 16B.

An end of an exhaust pipe 25 is coupled to the chamber 11 so as to communicate with inside the chamber 11. A vacuum pump 26 is coupled to the other end of the exhaust pipe 25. A valve 27 is provided at some midpoint in the exhaust pipe 25. An end of a pipe 28 for a gas for discharge is coupled to the chamber 11 so as to communicate with inside the chamber 11. The vacuum pump 26 may include a low vacuum pump and a high vacuum pump. The low vacuum pump may be first used and the high vacuum pump may be then used when the vacuum reaches a specific degree.

Figure 2:
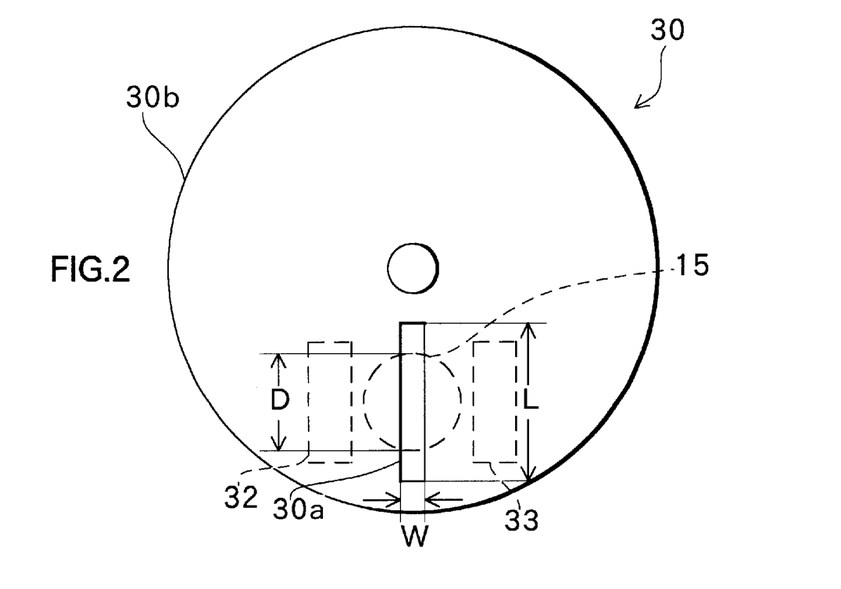
FIG. 2 is a magnified top view of the shutter shown in FIG. 1.

FIG. 2 is a magnified top view of the shutter 30. In the embodiment the opening 30a takes the shape of a narrow and long rectangle. Width W of the opening 30a is smaller than the length of the substrate 15 along the direction of width of the opening 30a. Since the substrate 15 takes a circular shape in the embodiment, width W of the opening 30a is smaller than diameter D of the substrate 15. If the substrate is rectangular, width W is shorter than a side of the substrate. It is preferred that width W of the opening 30a is 150 mm or below. The range between 10 to 70 mm is particularly preferable. Length L of the opening 30a is greater than diameter D of the substrate 15 or a side of a rectangular substrate.

The operation of the thin film forming apparatus 10 and thin film forming steps using the thin film forming apparatus 10 will now be described. The following description applies to a thin film forming method of the invention as well.

To form a thin film on the substrate 15, the substrate 15 is installed on the substrate holder 12. One or two targets corresponding to a desired thin film forming substance are installed on at least either the target holder 16A or 16B. Next, the inside of the chamber 11 is made vacuum by opening the valve 27 and operating the vacuum pump 26. A gas for discharge such as Ar is then introduced to the chamber 11 through the pipe 28. Next, power is supplied from the power source 24 selectively to either the target holder 16A or 16B through the switch 23 so as to generate a glow discharge and plasma in the chamber 11. In the embodiment power is supplied to the target holder 16A so that the thin film forming substance forming the target 17A is deposited on the substrate 15. In this case the substrate 15 is placed to face the target 17A. At this point the shutter 30 is placed such that the interceptor 30b faces the target 17A.

Next, the shutter 30 is rotated by the motor 31 at a specific speed so that the opening 30a of the shutter 30 is rotated and shifted. The position of the substrate 15 is fixed during the thin film forming steps.

The substance forming the target 17A is ejected by ions in the plasma impinging on the target 17A and goes through the opening 30a of the shutter 30 when the opening 30a passes between the target 17A and the substrate 15. The substance then arrives at the substrate 15 and deposits on the substrate 15. When the interceptor 30b of the shutter 30 is placed between the target 17A and the substrate 15, entry of the thin film forming substance from the target 17A to the substrate 15 is intercepted. In the embodiment the shutter 30 is rotated a plurality of times so that the opening 30a passes between the target 17A and the substrate 15 a plurality of times. The thin film forming substance thereby arrives at the substrate 15 from the target 17A a plurality of times in an intermittent manner. A thin film having a predetermined thickness is thus formed on the substrate 15.

The velocity at which the opening 30a moves with respect to the substrate 15 is preferably 10 m per minute or more in the center of the substrate 15. A velocity of 30 to 200 m per minute is particularly preferred.

In the embodiment a magnetic field may be applied during the thin film forming steps. For applying a magnetic field, as shown in FIG. 2, magnets 32 and 33 may be placed at sides of the substrate 15 on the substrate holder 12. The magnets 32 and 33 are placed such that surfaces of the magnets facing each other are magnetic poles different from each other. The magnets 32 and 33 correspond to a means (device) for applying a magnetic field.

According to the embodiment of the invention described so far, the substrate 15 and the target 17A are fixed, and the shutter 30 is rotated a plurality of times between the substrate 15 and the target 17A so that the opening 30a passes between the target 17A and the substrate 15 a plurality of times. The thin film forming substance thereby arrives at the substrate 15 from the target 17A a plurality of times in an intermittent manner. The thin film forming substance thus intermittently deposits on the substrate 15 and a thin film having a predetermined thickness is thus formed. As a result, according to the embodiment, thin films having a variety of thicknesses are formed by controlling the number of times of entry of the thin film forming substance from the target 17A to the substrate 15, that is, the number of times of deposition of the thin film forming substance on the substrate 15. Since a thin film having a desired thickness is formed through depositing the thin film forming substance a plurality of times in the embodiment, an error of the amount of deposit resulting from a single step of deposition is easily cancelled out by a plurality of times of deposition. An error resulting in the thickness of the thin film finally obtained is therefore smaller than an error resulting in the thickness of the thin film formed through a single step of deposition. Thin films having a variety of thicknesses are thus formed with accuracy according to the embodiment of the invention. The amount of deposition of the thin film forming substance per single step of deposition is appropriately determined by changing the shape and size of the opening 30a, the velocity of the opening 30a and so on.

According to the embodiment, the opening 30a of the shutter 30 takes the shape of a slit whose width is smaller than the diameter of the substrate 15. As a result, the time during which the substrate 15 faces the opening 30a is equal throughout the substrate 15 when the opening 30a passes between the target 17A and the substrate 15. The thickness distribution on the substrate 15 is thereby made uniform.

According to the embodiment, the film thickness is controllable by adjusting the shape, size, velocity, number of rotation and so on of the opening 30a. As a result, it is no more necessary to control the film thickness by changing the conditions that affect the film forming speed such as the electric power applied to the target, the distance between the target and the substrate, and the pressure of the gas for discharge. A change in properties of the thin film, such as a change in magnetic properties of the magnetic layer depending on the power applied to the target, is thereby prevented.

According to the embodiment, the substrate 15 is fixed during the film forming steps. As a result, when the film is formed while a magnetic field is applied, the magnetic field is not changed in the chamber 11. The discharge is therefore stabilized and accuracy of film thickness control is maintained. Accuracy of film thickness control is thus improved.

Figure 3:
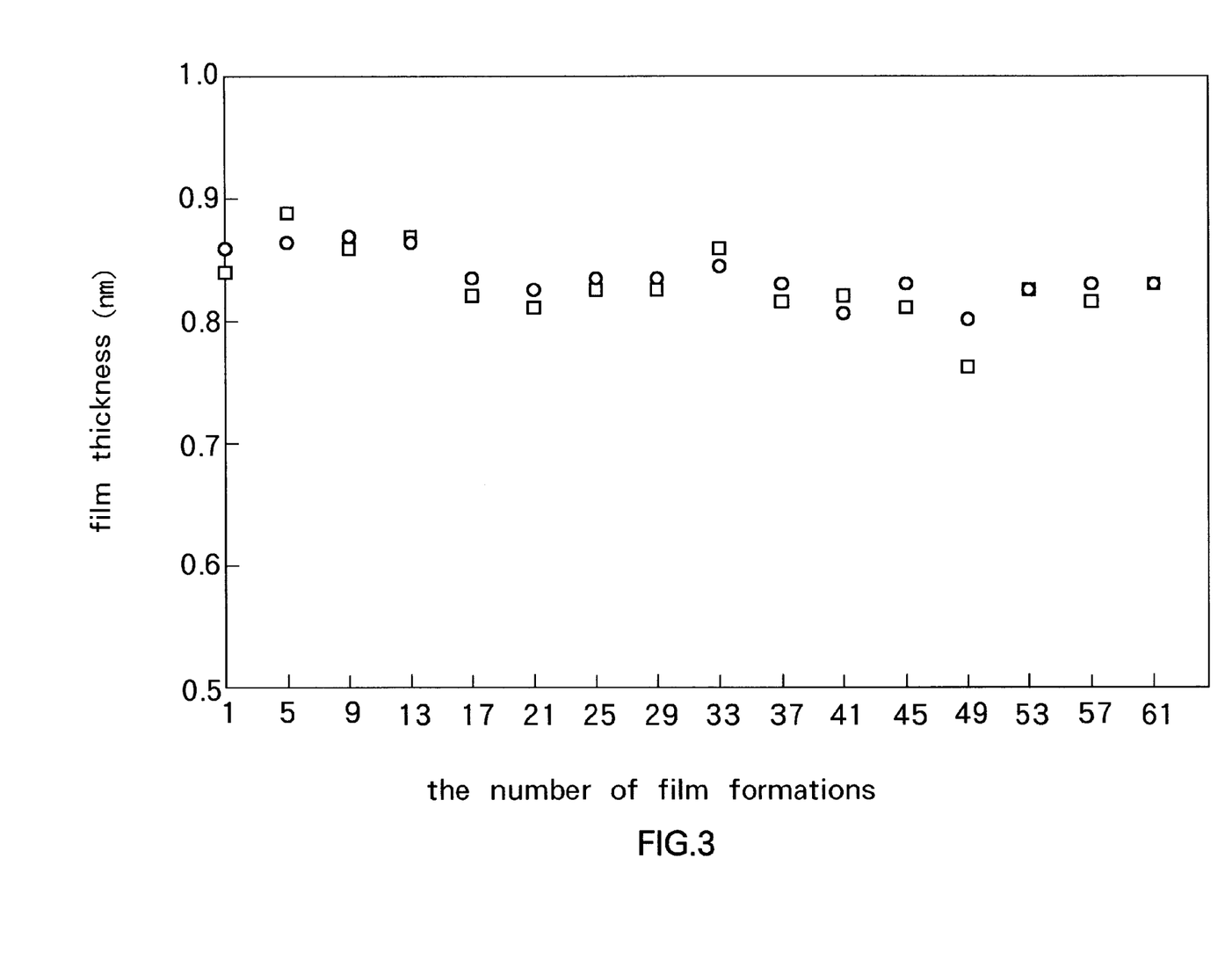
FIG. 3 is a plot for indicating the result of film thickness stability compared between a case in which a thin film is formed by a thin film forming apparatus of a comparison example and a case in which a thin film is formed by the thin film forming apparatus shown in FIG. 1.

Reference is now made to FIG. 3 for describing film thickness stability compared between a case in which a thin film is formed by the thin film forming apparatus 110 shown in FIG. 6 (a comparison example) and a case in which a thin film is formed by the thin film forming apparatus 10 of the embodiment shown in FIG. 1 (a case of the embodiment of the invention).

The film forming conditions are as follows. For both the comparison example and the embodiment case, a thin film to be formed (a thin film forming substance) is NiFe (Permalloy). The power applied per unit area of the target is 3 W/cm$^2$. The gas used for discharge is Ar and the pressure is $1.5\times10^{-1}$ Pa. In the comparison example, the thin film is formed through rotating the substrate 115 only once. The velocity of the substrate 115 is 25 m per minute in the center of the substrate 115. The diameter of the opening 114a of the shutter 114 is 200 mm. In the embodiment case, the substrate 15 is fixed, the shutter 30 is rotated four times and deposition of the thin film forming substance on the substrate 15 is intermittently performed four times to form the thin film. The velocity of the substrate 15 is 40 m per minute in the center of the substrate 15. The width (W) of the opening 30a of the shutter 30 is 50 mm.

Film formation is performed 61 times both in the comparison example and the embodiment case. FIG. 3 shows the thicknesses obtained in the $(1+4n)^{th}$ film formation where n is an integer from 0 to 15. In the graph squares indicate the comparison example and circles indicate the embodiment case. The average film thickness of the comparison example is nearly equal to that of the embodiment case. The value of $3\sigma$ ($\sigma$ is the standard deviation) based on the data shown in FIG. 3 is 0.09 nm in the comparison example and 0.06 nm in the embodiment case. The result is that the film thickness stability is more excellent in the embodiment case than in the comparison example.

Figure 4:
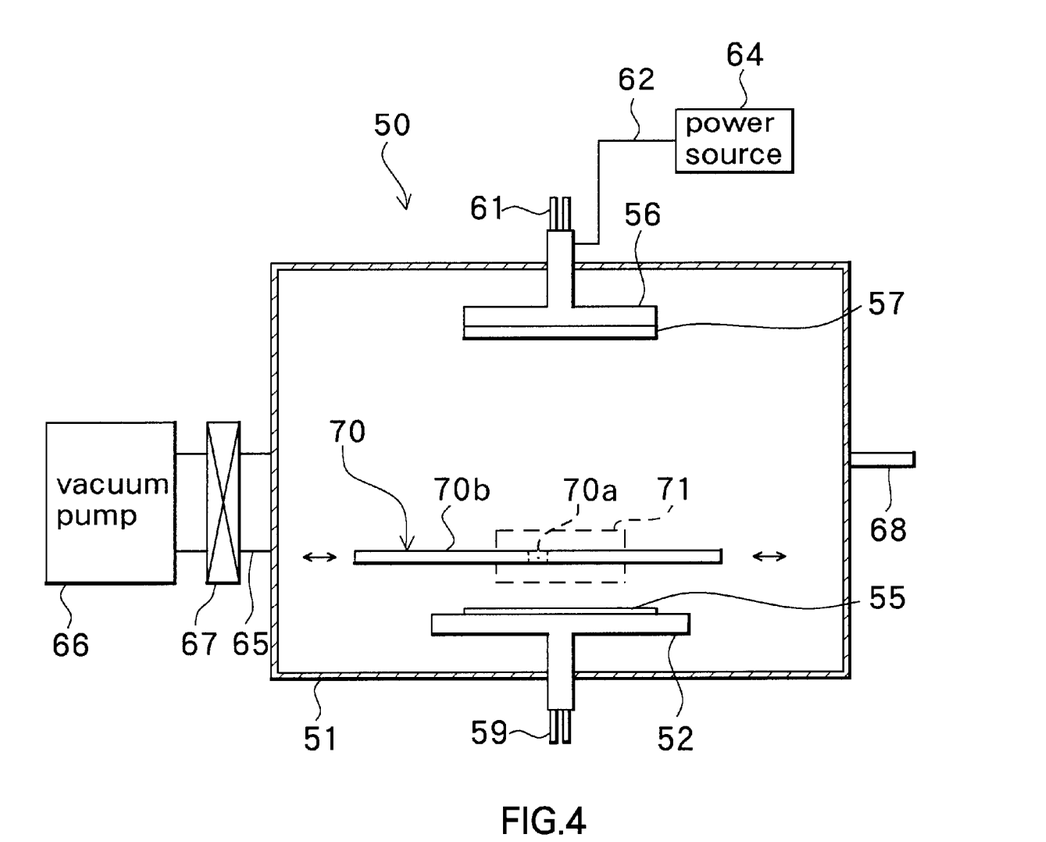
FIG. 4 is a schematic cross section of a thin film forming apparatus of a second embodiment of the invention.
Figure 5:
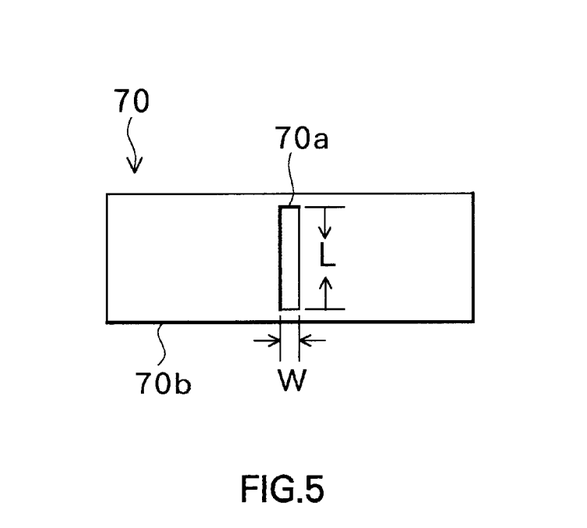
FIG. 5 is a top view of the shutter shown in FIG. 4.

FIG. 4 is a schematic cross section of a thin film forming apparatus of a second embodiment of the invention. FIG. 5 is a top view of the shutter shown in FIG. 4. The thin film forming apparatus 50 of the second embodiment is an example in which a slit of the shutter moves in a reciprocating manner.

The thin film forming apparatus 50 comprises: a chamber 51; a substrate holder 52 placed near the lower end in the chamber 51 and functioning as an anode as well; a target holder 56 placed near the upper end in the chamber 51 and functioning as a cathode as well; and a shutter 70 placed between the substrate holder 52 and the target holder 56. The substrate holder 52 may hold a substrate 55. The target holder 56 may hold a target 57.

The target 57 corresponds to the thin film forming substance supply source of the invention. The target holder 56 corresponds to the supply source holding means (holder) of the invention. The substrate 55 corresponds to the object on which the thin film is to be formed of the invention. The substrate holder 52 corresponds to the object holding means (holder) of the invention.

As shown in FIG. 5, the shutter 70 as a whole takes the shape of a rectangular plate and has an opening 70a having a shape of a slit, in the center of the length of the shutter 70, extending in the direction orthogonal to the direction of the length of the shutter 70. The opening 70a allows a thin film forming substance to arrive at the substrate 55 from the target 57. The part of the shutter 70 other than the opening 70a is an interceptor 70b for intercepting the thin film forming substance arriving at the substrate 55 from the target 57. It is particularly preferable that the distance between the shutter 70 and the substrate 55 is 100 mm or below.

A driver of an actuator 71 capable of reciprocating provided outside the chamber 51 such as a linear motor is coupled to the shutter 70 so that the shutter 70 is reciprocated in a horizontal direction by the actuator 71. The actuator 71 corresponds to a shifting means (device) of the invention.

A cooling water duct 59 is provided near the substrate holder 52. The substrate holder 52 is cooled by letting cooling water flow through the duct 59.

A cooling water duct 61 is provided near the target holder 56. The target holder 56 is cooled by letting cooling water flow through the duct 61. An end of a power supply cable 62 is connected to the target holder 56. The other end of the cable 62 is connected to a power source 64. The power source 64 may apply either a direct-current negative voltage or a high frequency voltage to the target holder 56.

An end of an exhaust pipe 65 is coupled to the chamber 51 so as to communicate with inside the chamber 51. A vacuum pump 66 is coupled to the other end of the exhaust pipe 65. A valve 67 is provided at some midpoint in the exhaust pipe 65. An end of a pipe 68 for a gas used for discharge is coupled to the chamber 51 so as to communicate with inside the chamber 51.

FIG. 5 is a top view of the shutter 70. In the embodiment the opening 70a takes the shape of a narrow and long rectangle. As in the first embodiment, width W of the opening 70a is smaller than the length of the substrate 55 in the direction of width. Since the substrate 55 takes a circular shape in the embodiment, width W of the opening 70a is smaller than diameter D of the substrate 55. If the substrate is rectangular, width W is shorter than a side of the substrate. Length L of the opening 70a is greater than the diameter of the substrate 55 or a side of a rectangular substrate.

The operation of the thin film forming apparatus 50 and thin film forming steps using the thin film forming apparatus 50 will now be described. The following description applies to a thin film forming method of the embodiment as well. To form a thin film on the substrate 55, the substrate 55 is installed on the substrate holder 52. The target 57 corresponding to a desired thin film forming substance is installed on the target holder 56. Next, the inside of the chamber 51 is made vacuum by opening the valve 67 and operating the vacuum pump 66. A gas for discharge such as Ar is then introduced to the chamber 51 through the pipe 68. Next, power is supplied from the power source 64 to the target holder 56 so as to generate a glow discharge and plasma in the chamber 51. At this point the shutter 70 is placed such that the interceptor 70b faces the target 57. Next, the shutter 70 is reciprocated at a specific speed by the actuator 71 so that the opening 70a moves in a reciprocating manner.

The substance forming the target 57 is ejected by ions in the plasma impinging on the target 57 and goes through the opening 70a of the shutter 70 when the opening 70a passes between the target 57 and the substrate 55. The substance then arrives at the substrate 55 and deposits on the substrate 55. When the interceptor 70b of the shutter 70 is placed between the target 57 and the substrate 55, entry of the thin film forming substance from the target 57 to the substrate 55 is intercepted. In the embodiment the shutter 70 is reciprocated a plurality of times so that the opening 70a passes between the target 57 and the substrate 55 a plurality of times. The thin film forming substance thereby arrives at the substrate 55 from the target 57 a plurality of times in an intermittent manner. A thin film having a predetermined thickness is thus formed on the substrate 55.

In the embodiment, as in the first embodiment, a magnetic field may be applied during the thin film forming steps. The remainder of the configuration, operation and effects of the second embodiment are similar to those of the first embodiment.

The invention is not limited to the foregoing embodiments. For example, components used in a typical thin film forming apparatus may be used as the components of the thin film forming apparatus of the embodiments.

The number and the shape of the substrate and the target are not limited to those illustrated in the foregoing embodiments. The configuration of the thin film forming apparatus of the invention is not limited to those of the embodiments. To be specific, for example, the electrodes facing each other may be placed side by side instead of the vertical arrangement as in the embodiments. A plurality of chambers may be provided so as to improve the state of vacuum.

Although the foregoing embodiments illustrate the thin film forming method and apparatus using sputtering, the invention is not limited to sputtering but may be widely applied to thin film forming methods and apparatuses using PVD such as vacuum evaporation, ion plating, ion beam deposition, and cluster ion beam deposition.

According to the thin film forming method of the invention described so far, control is performed on the intercepting means (device) capable of selecting between interception and allowance of entry of the thin film forming substance from the supply source to the object. The thin film having a predetermined thickness is formed on the object by having the thin film forming substance arrive at the object from the supply source a plurality of times in an intermittent manner through the control of the intercepting means (device). As a result, precise control of the film thickness is achieved.

In the method of the invention the intercepting means (device) may be used, including: an interceptor for intercepting entry of the thin film forming substance from the supply source to the object; and an opening having a shape of a slit whose width is smaller than the length of the object along the direction of the width of the opening and allowing entry of the thin film forming substance from the supply source to the object. The thin film forming substance is made to arrive at the object from the supply source a plurality of times in an intermittent manner by shifting the opening of the intercepting means (device). As a result, the film thickness distribution is made uniform.

In the method of the invention the thin film may be formed while the object is fixed and a magnetic field is applied near the object. As a result, accuracy of film thickness control is improved when the thin film is formed with an application of the magnetic field.

The apparatus of the invention has an intercepting means (device) placed between the supply source held by the supply source holding means and the object held by the object holding means, being capable of selecting between interception and allowance of entry of the thin film forming substance from the supply source to the object. The intercepting means (device) includes: an interceptor for intercepting entry of the thin film forming substance from the supply source to the object; and an opening having a shape of a slit whose width is smaller than the length of the object along the direction of the width of the opening and allowing entry of the thin film forming substance from the supply source to the object; and a shifting means (device) for shifting the opening. As a result, precise film thickness control is achieved by controlling the number of times of entry of the thin film forming substance from the supply source to the object by the intercepting means (device).

The apparatus of the invention may further comprise a means (device) for applying a magnetic field near the object. As a result, accuracy of film thickness control is improved when the thin film is formed with an application of the magnetic field.

Obviously many modifications and variations of the present invention are possible in the light of the above teachings. It is therefore to be understood that within the scope of the appended claims the invention may be practiced otherwise than as specifically described.

What is claimed is:

1. A method of forming a thin film by having a thin film forming substance emitted from a thin film forming substance supply source arrive at and deposit on an object, comprising the steps of:

providing an intercepting device placed between the supply source and the object, the intercepting device selecting between interception and allowance of arrival of the thin film forming substance at the object from the supply source; and forming the thin film having a predetermined thickness on the object, wherein the step of forming the thin film includes the steps of:

having the thin film forming substance, to form the thin film having the predetermined thickness, arrive at the object from the supply source a plurality of times in an intermittent manner by shifting the intercepting device during formation of the thin film while the supply source and the object are fixed, wherein the intercepting device comprises an interceptor for intercepting arrival of the thin film forming substance from the supply source and an opening having a shape of a slit whose width is smaller than the length of the object along the direction of the width of the opening, the opening being shifted with the intercepting device and allowing deposition of the thin film forming substance on the object from the supply source; and controlling the thickness of the thin film by controlling the number of times of having the substance arrive at the object in the step of having the thin film substance arrive at the object as a result of the shifting of the opening and the intercepting device.

2. A method according to claim 1 wherein the opening is shifted in a rotating manner.

3. A method according to claim 1 wherein the opening is shifted in a reciprocating manner.

4. A method according to claim 1 wherein the thin is formed while a magnetic field is applied to the object.

* * * * *